United States Patent [19]
Chang et al.

[11] Patent Number: 6,074,917
[45] Date of Patent: Jun. 13, 2000

[54] LPCVD OXIDE AND RTA FOR TOP OXIDE OF ONO FILM TO IMPROVE RELIABILITY FOR FLASH MEMORY DEVICES

[75] Inventors: Kent Kuohua Chang, Cupertino; David Chi, Sunnyvale; Chin-Yang Sun, Ukiah, all of Calif.

[73] Assignee: Advanced Micro Devices, Inc., Sunnyvale, Calif.

[21] Appl. No.: 09/189,227

[22] Filed: Nov. 11, 1998

Related U.S. Application Data

[63] Continuation-in-part of application No. 09/098,292, Jun. 16, 1998.

[51] Int. Cl.⁷ ........................... H01L 21/336; H01L 21/31
[52] U.S. Cl. ........................... 438/261; 438/786; 438/954
[58] Field of Search .................................... 438/261, 786, 438/954

[56] References Cited

U.S. PATENT DOCUMENTS

| | | | |
|---|---|---|---|
| 4,698,787 | 10/1987 | Mukherjee et al. | 365/185 |
| 5,231,299 | 7/1993 | Ning et al. | 257/316 |
| 5,397,720 | 3/1995 | Kwong et al. | 437/40 |
| 5,420,060 | 5/1995 | Gill et al. | 437/52 |
| 5,457,336 | 10/1995 | Fang et al. | 257/322 |
| 5,467,308 | 11/1995 | Chang et al. | 365/185.01 |
| 5,496,756 | 3/1996 | Sharma et al. | 437/52 |
| 5,512,505 | 4/1996 | Yuan et al. | 437/43 |
| 5,541,436 | 7/1996 | Kwong et al. | 257/410 |
| 5,591,681 | 1/1997 | Wristers et al. | 437/240 |
| 5,654,217 | 8/1997 | Yuan et al. | 438/588 |
| 5,674,788 | 10/1997 | Wristers et al. | 437/239 |

OTHER PUBLICATIONS

Olivo et al. Charge Trapping and Retention in Ultra–Thin ONOStructures, Solid State Electronics, 1991.

Olivo, P., Z.A. Weinberg, K.J. Stein and D.S. Wen, "Charge Trapping And Retention In Ultra–Thin Oxide–Nitride–Oxide Structures", Solid State Electronics, vol. 34, No. 6, pp. 609–611, 1991, no month.

*Primary Examiner*—John F. Niebling
*Assistant Examiner*—Alexander G. Ghyka
*Attorney, Agent, or Firm*—Renner, Otto, Boisselle & Sklar, LLP

[57] ABSTRACT

In one embodiment, the present invention relates to a method of forming a flash memory cell, involving the steps of forming a tunnel oxide on a substrate; forming a first polysilicon layer over the tunnel oxide; forming an insulating layer over the first polysilicon layer, the insulating layer comprising a first oxide layer over the first polysilicon layer, a nitride layer over the first oxide layer, and a second oxide layer over the nitride layer, wherein the second oxide layer is made by forming the second oxide layer by low pressure chemical vapor deposition at a temperature from about 600° C. to about 850° C. using $SiH_4$ and $N_2O$ and annealing in an $N_2O$ atmosphere at a temperature from about 700° C. to about 950° C.; forming a second polysilicon layer over the insulating layer; etching at least the first polysilicon layer, the second polysilicon layer and the insulating layer, thereby defining at least one stacked gate structure; and forming a source region and a drain region in the substrate, thereby forming at least one memory cell.

20 Claims, 2 Drawing Sheets

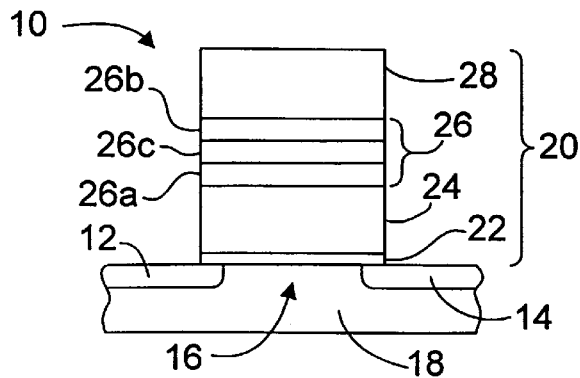
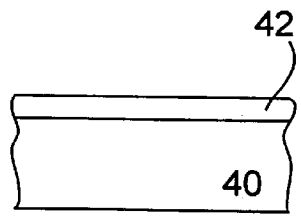
FIG. 1 PRIOR ART
FIG. 2A
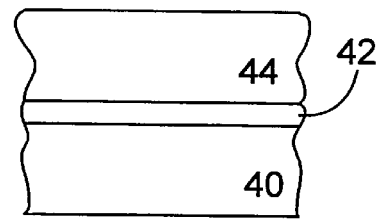
FIG. 2B
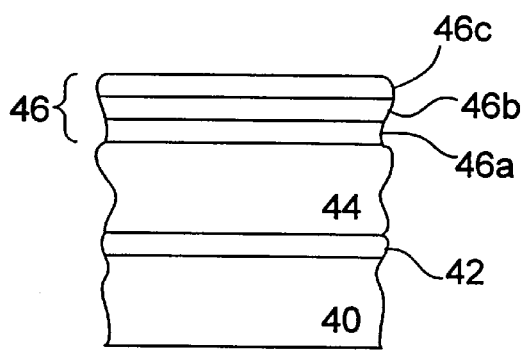
FIG. 2C
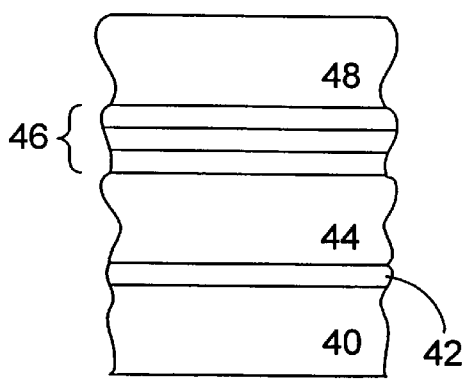
FIG. 2D
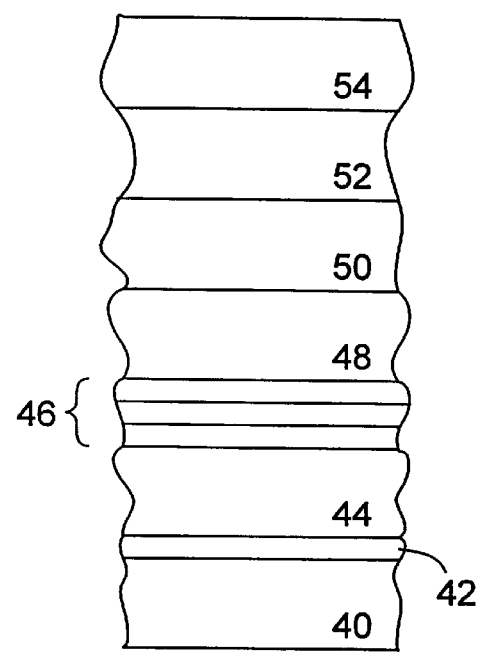
FIG. 2E

LPCVD OXIDE AND RTA FOR TOP OXIDE OF ONO FILM TO IMPROVE RELIABILITY FOR FLASH MEMORY DEVICES

RELATED APPLICATION

This application is a continuation-in-part of co-pending application Ser. No. 09/098,292 filed on Jun. 16, 1998.

TECHNICAL FIELD

The present invention generally relates to flash memory devices such as EEPROMs. More particularly, the present invention relates to flash memory devices exhibiting less charge trapping, less charge leakage and increased tunnel oxide reliability.

BACKGROUND ART

Nonvolatile memory devices include flash EEPROMs (electrical erasable programmable read only memory devices). FIG. 1 represents the relevant portion of a typical flash memory cell 10. The memory cell 10 typically includes a source region 12, a drain region 14 and a channel region 16 in a substrate 18; and a stacked gate structure 20 overlying the channel region 16. The stacked gate 20 includes a thin gate dielectric layer 22 (commonly referred to as the tunnel oxide) formed on the surface of the substrate 18. The stacked gate 20 also includes a polysilicon floating gate 24 which overlies the tunnel oxide 22 and an interpoly dielectric layer 26 which overlies the floating gate 24. The interpoly dielectric layer 26 is often a multilayer insulator such as an oxide-nitride-oxide (ONO) layer having two oxide layers 26a and 26b sandwiching a nitride layer 26c. Lastly, a polysilicon control gate 28 overlies the interpoly dielectric layer 26. The channel region 16 of the memory cell 10 conducts current between the source region 12 and the drain region 14 in accordance with an electric field developed in the channel region 16 by the stacked gate structure 20.

Generally speaking, a flash memory cell is programmed by inducing hot electron injection from a portion of the substrate, such as the channel section near the drain region, to the floating gate. Electron injection carries negative charge into the floating gate. The injection mechanism can be induced by grounding the source region and a bulk portion of the substrate and applying a relatively high positive voltage to the control electrode to create an electron attracting field and applying a positive voltage of moderate magnitude to the drain region in order to generate "hot" (high energy) electrons. After sufficient negative charge accumulates on the floating gate, the negative potential of the floating gate raises the threshold voltage ($V_{th}$) of its field effect transistor (FET) and inhibits current flow through the channel region through a subsequent "read" mode. The magnitude of the read current is used to determine whether or not a flash memory cell is programmed. The act of discharging the floating gate of a flash memory cell is called the erase function. The erase function is typically carried out by a Fowler-Nordheim tunneling mechanism between the floating gate and the source region of the transistor (source erase or negative gate erase) or between the floating gate and the substrate (channel erase). A source erase operation is induced by applying a high positive voltage to the source region and a 0 V to the control gate and the substrate while floating the drain of the respective memory cell.

Referring again to FIG. 1, conventional source erase operations for the flash memory cell 10 operate in the following manner. The memory cell 10 is programmed by applying a relatively high voltage $V_G$ (e.g., approximately 12 volts) to the control gate 28 and a moderately high voltage $V_D$ (e.g, approximately 9 volts) to the drain region 14 in order to produce "hot" electrons in the channel region 16 near the drain region 14. The hot electrons accelerate across the tunnel oxide 22 and into the floating gate 24 and become trapped in the floating gate 24 since the floating gate 24 is surrounded by insulators (the interpoly dielectric 26 and the tunnel oxide 22). As a result of the trapped electrons, the threshold voltage of the memory cell 10 increases by about 3 to 5 volts. This change in the threshold voltage (and thereby the channel conductance) of the memory cell 10 created by the trapped electrons causes the cell to be programmed.

To read the flash memory cell 10, a predetermined voltage $V_G$ that is greater than the threshold voltage of an unprogrammed cell, but less than the threshold voltage of a programmed cell, is applied to the control gate 28. If the memory cell 10 conducts, then the memory cell 10 has not been programmed (the cell 10 is therefore at a first logic state, e.g., a zero "0"). Likewise, if the memory cell 10 does not conduct, then the memory cell 10 has been programmed (the cell 10 is therefore at a second logic state, e.g., a one "1"). Consequently, it is possible to read each cell 10 to determine whether or not it has been programmed (and therefore identify its logic state).

In order to erase the flash memory cell 10, a relatively high voltage $V_S$ (e.g., approximately 12 volts) is applied to the source region 12 and the control gate 28 is held at a ground potential ($V_G=0$), while the drain region 14 is allowed to float. Under these conditions, a strong electric field is developed across the tunnel oxide 22 between the floating gate 24 and the source region 12. The electrons that are trapped in the floating gate 24 flow toward and cluster at the portion of the floating gate 24 overlying the source region 22 and are extracted from the floating gate 24 and into the source region 12 by way of Fowler-Nordheim tunneling through the tunnel oxide 22. Consequently, as the electrons are removed from the floating gate 24, the memory cell 10 is erased.

The ONO interpoly dielectric layer has a number of important functions including insulating the control gate from the floating gate. Accordingly, it is desirable to form a high quality ONO interpoly dielectric layer. When forming an ONO interpoly dielectric layer, there are a number of concerns. For example, if the top oxide layer is too thick, the required programming voltage increases undesirably. On the other hand, if the top oxide layer is too thin (for example, less than 10 Å), charge retention time decreases undesirably since the charge tends to leak. Precisely controlling the thickness of the top oxide layer is a notable concern. Moreover, if the nitride layer is too thin, charge leakage from the floating gate to the control gate may be caused, further decreasing charge retention time.

The top oxide layer of an ONO interpoly dielectric layer is conventionally formed by a high temperature wet oxidation process. Such a process involves oxidizing the nitride layer in steam and oxygen at a temperature of about 950° C. for about 40 minutes. Grown oxides, such as those grown using a wet oxidation process, typically are prone to fewer problems compared with deposited oxides. For example, the undesirable presence of contaminant particles, nonuniform molecular structure, and uneven thickness are problems commonly associated with deposited oxides.

Nevertheless, a number of problems are also associated with forming the top oxide layer using a wet oxidation process. One problem is that the process may consume an undesirably large amount of the nitride film. Consequently, the resultant nitride layer is thinned which can cause charge leakage from the floating gate to the control gate. Another problem is that the relatively long process time and relatively high temperature may degrade the tunnel oxide. Furthermore, such a process sometimes leads to junction problems at the nitride layer—top oxide layer interface.

In view of the aforementioned concerns and problems, there is a need for flash memory cells of improved quality and more efficient methods of making such memory cells.

SUMMARY OF THE INVENTION

As a result of the present invention, a flash memory cell having improved reliability is obtainable by providing an improved ONO interlayer dielectric layer. By forming a top oxide layer having a low defect density and less interface traps despite using a deposition process, charge leakage from the floating gate to the control gate is prevented while Fowler-Nordheim electron tunneling is facilitated. Moreover, forming a top oxide layer in accordance with the present invention does not degrade or deleteriously effect the underlying nitride layer of the ONO interlayer dielectric layer. The present invention also makes it possible to precisely control the thickness of the top oxide layer despite using a deposition process. Another advantage associated with the present invention is that the nitride layer and the top oxide layer are more compatible thereby minimizing junction problems therebetween.

In one embodiment, the present invention relates to a method of forming a flash memory cell, involving the steps of forming a tunnel oxide on a substrate; forming a first polysilicon layer over the tunnel oxide; forming an insulating layer over the first polysilicon layer, the insulating layer comprising a first oxide layer over the first polysilicon layer, a nitride layer over the first oxide layer, and a second oxide layer over the nitride layer, wherein the second oxide layer is made by forming the second oxide layer by low pressure chemical vapor deposition at a temperature from about 600° C. to about 850° C. using $SiH_4$ and $N_2O$, and annealing in an $N_2O$ atmosphere at a temperature from about 700° C. to about 950° C.; forming a second polysilicon layer over the insulating layer; etching at least the first polysilicon layer, the second polysilicon layer and the insulating layer, thereby defining at least one stacked gate structure; and forming a source region and a drain region in the substrate, wherein the source region and the drain region are self-aligned by the stacked gate structure, thereby forming at least one memory cell.

In another embodiment, the present invention relates to a method of forming an ONO insulating layer for a flash memory cell without substantially decreasing nitride layer thickness, involving the steps of depositing a first oxide layer; depositing a nitride layer to a first thickness; and depositing a second oxide layer by low pressure chemical vapor deposition at a temperature from about 600° C. to about 850° C. using $SiH_4$ and $N_2O$, and annealing the second oxide layer in an $N_2O$ atmosphere at a temperature from about 700° C. to about 950° C., wherein the nitride layer has a second thickness after deposition of the second oxide layer, and the second thickness is at least 95% of the first thickness.

In yet another embodiment, the present invention relates to a method of decreasing charge leakage from a floating gate to a control gate in a flash memory cell comprising a substrate, a tunnel oxide over the substrate, the floating gate over the tunnel oxide, an ONO insulating layer over the floating gate, and the control gate over the ONO insulating layer, wherein the ONO insulating layer comprises a first oxide layer over the floating gate, a nitride layer over the first oxide layer and a second oxide layer over the nitride layer, involving the steps of forming the second oxide layer by low pressure chemical vapor deposition at a temperature from about 700° C. to about 800° C. using $SiH_4$ and $N_2O$; and annealing in an $N_2O$ atmosphere at a temperature from about 750° C. to about 900° C.

BRIEF DESCRIPTION OF DRAWINGS

FIG. 1 is a cross-sectional view of relevant portions of a conventional memory cell in a flash memory cell.

FIGS. 2A to 2H are cross-sectional views illustrating a flash memory cell fabrication method according to one embodiment of the present invention.

DISCLOSURE OF INVENTION

Figure 2F:
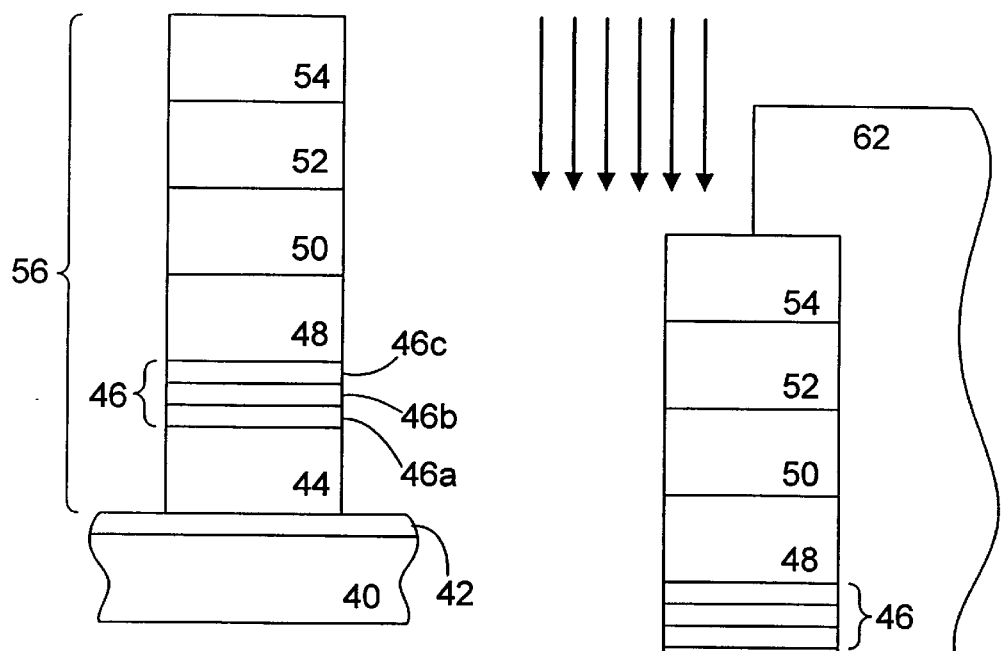
Figure 2G:
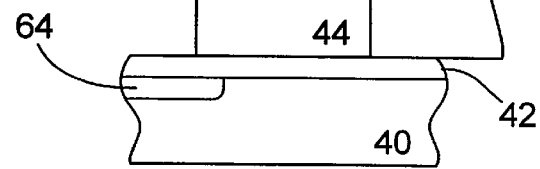

By forming a top oxide layer having a low defect density and less interface traps, the reliability of the interpoly dielectric layer can be increased in flash memory cells. While not wishing to be bound to any theory, it is believed that by forming a top oxide layer according to the present invention, it is consequently possible to prevent charge leakage from the floating gate to the control gate and facilitate Fowler-Nordheim electron tunneling thereby enhancing the erase operation.

According to the present invention, the top oxide layer of an ONO dielectric layer (an oxide/nitride/oxide multilayer dielectric layer) is formed by a two step process. In particular, the process conditions for forming the top oxide layer involve depositing an oxide by low pressure chemical vapor deposition (LPCVD) followed by a rapid thermal anneal (RTA).

Depositing the oxide by LPCVD is conducted at a temperature from about 600° C. to about 850° C. and a pressure from about 400 mTorr to about 750 mTorr. In a preferred embodiment, the temperature is from about 700° C. to about 800° C. and the pressure is from about 500 mTorr to about 700 mTorr. The gas flow includes $SiH_4$ and $N_2O$. Although not generally required, the gas flow may optionally include an inert gas such as a noble gas or nitrogen. Nobles gases include He, Ne, Ar, Kr, and Xe. The gas flow generally contains a sufficient amount of $SiH_4$ and $N_2O$ to form an oxide layer (an $SiO_2$ layer). During LPCVD, it is believed that the following chemical reaction takes place.

$$SiH_4 + 4N_2O \rightarrow SiO_2 + 2H_2O + 4N_2$$

In one embodiment, the gas flow contains from about 10 standard cubic centimeters per minute (sccm) to about 30 sccm $SiH_4$ and from about 1 l to about 4 l $N_2O$. In another embodiment, the gas flow contains from about 15 sccm to about 25 sccm $SiH_4$ and from about 1.1 l to about 2 l $N_2O$.

LPCVD is conducted for a time sufficient to form an initial oxide layer of desired thickness wherein the time depends upon the deposition rate. In one embodiment, the LPCVD deposition rate is from about 3 Å/min to about 6 Å/min. In another embodiment, the LPCVD deposition rate is from about 3.5 Å/min to about 5.5 Å/min. In yet another embodiment, the LPCVD deposition rate is from about 4 Å/min to about 5 Å/min.

The thickness of the LPCVD oxide is sufficient to provide a resultant top oxide layer (after RTA) having a thickness from about 20 Å to about 80 Å. In one embodiment, the initial oxide layer (formed by LPCVD in the first step of the two step process) has a thickness from about 20 Å to about 80 Å. In another embodiment, the initial oxide layer formed by LPCVD has a thickness from about 30 Å to about 60 Å. The LPCVD provides an oxide layer having a low defect density without substantially decreasing the thickness or deleteriously effecting the underlying nitride layer. In one embodiment, after forming the top oxide layer over a nitride layer, the nitride layer retains at least about 95% of its thickness (compared to before LPCVD), and preferably about 100% of its thickness.

After depositing the oxide layer by LPCVD, RTA is performed. RTA of the oxide layer is preferably conducted in an $N_2O$ atmosphere. An $N_2O$ atmosphere includes at least about 95% $N_2O$ (an inert gas constituting any remainder), preferably at least about 99% $N_2O$, and more preferably about 100% $N_2O$. In one embodiment, RTA is conducted at a temperature from about 700° C. to about 950° C. In a preferred embodiment, RTA is conducted at a temperature from about 750° C. to about 900° C.

In one embodiment, RTA is conducted for a time from about 40 seconds to about 80 seconds. In a preferred embodiment, RTA is conducted for a time from about 50 seconds to about 70 seconds. The RTA serves to decrease the defect density of the oxide layer. The RTA also serves to reduce charge trapping in the top oxide layer of the completed flash memory cell. It is believed that at elevated temperatures, $N_2O$ dissociates into nitrogen gas ($N_2$) and reactive atomic oxygen. It is also believed that the reactive atomic oxygen diffuses into the LPCVD oxide layer repairing oxygen vacancies, thereby reducing the defect density and leakage current.

After LPCVD and RTA, the thickness of the resultant top oxide layer formed in accordance with the invention is from about 20 Å to about 80 Å. In another embodiment, the thickness of the resultant top oxide layer formed in accordance with the invention is from about 30 Å to about 60 Å. The resultant top oxide layer has a substantially uniform thickness and a low defect density.

Referring to FIGS. 2A to 2H, the fabrication of a single flash memory cell is described. A plurality of flash memory cells can be formed on a semiconductor substrate, such as a silicon die, each with an N-type source region and N-type drain region formed within a P portion of the substrate and a P-type channel region interposed between the source and drain regions in accordance with the present invention. Although fabrication of one flash memory cell is described below, it will be understood by those skilled in the art that the methods described herein are applicable to mass production methods wherein two or more cells are formed.

Specifically referring to FIG. 2A, a P-type substrate 40 is provided. Thereafter, a thin tunnel oxide layer 42 is formed over the substrate 40 having a thickness of, for example, about 50 Å to about 150 Å using a thermal growth process in a dry oxidation furnace. For instance, the tunnel oxide layer 42 can be formed via dry oxidation at a temperature of about 1050° C., under an atmosphere of oxygen at about 1.33 l, HCl at about 70 cc and argon at about 12.6 l. Alternatively, the tunnel oxide can be formed from oxynitride.

Referring to FIG. 2B, a phosphorus doped polysilicon layer is deposited via CVD to form a doped polysilicon layer 44 at 530° C., 400 mTorr, $SiH_4$ at 2000 sccm, and a mixture of 1% by weight $PH_3$ in helium at about 22 sccm. Doping lowers the resistivity of the polysilicon rendering it conductive.

A multi-layer interpoly dielectric 46 is then formed over the surface of the substrate 40, as illustrated in FIG. 2C. This layer 46 is often called the interpoly dielectric since (as will be seen shortly) it is sandwiched between the phosphorus doped polysilicon layer (first polysilicon layer constituting the floating gate for a flash memory cell) and a second polysilicon layer which forms the control gate for the cell. The interpoly dielectric 46 is preferably a three layer region of oxide/nitride/oxide (a so called "ONO" layer) and typically has a total thickness of about 120 Å to about 400 Å. Generally speaking, the ONO layer 46 is formed by repetitive depositions of oxide, nitride and oxide to form a dielectric layer in which the nitride is sandwiched between a bottom oxide layer and top oxide layer.

Specifically referring to FIG. 2C, a first or bottom oxide layer 46a is deposited using CVD techniques. For example, a bottom oxide layer 46a is deposited at a temperature of about 750° C. under $SiH_4$ at 20 sccm, $N_2O$ at 1.2 l, and a carrier gas and a pressure of 600 mTorr via LPCVD oxide on the first polysilicon layer. The bottom oxide layer may have a suitable thickness, for example, from about 40 Å to about 60 Å, but typically the thickness is about 50 Å. A nitride layer 46b is next deposited also using CVD techniques. For example, nitride is deposited at a temperature of about 760° C. under $NH_3$ at 600 sccm, $SiH_2Cl_2$ at 100 sccm and a pressure of 330 mTorr to form a nitride layer 46b. The nitride layer 46b may have a suitable thickness, for example, from about 60 Å to about 100 Å, preferably from about 70 Å to about 90 Å, but typically the thickness is about 80 Å.

The second or top oxide layer 46c is formed by initially performing LPCVD at a temperature of about 750° C. and a pressure of about 600 mTorr using a gas flow containing about 1.2 l $N_2O$ and about 20 sccm $SiH_4$ for about 9 minutes to provide an LPCVD initial oxide layer having a thickness of about 40 Å. Next, RTA of the LPCVD oxide layer is conducted in an $N_2O$ atmosphere at a temperature of about 800° C. for about 60 seconds. The top oxide layer may have a thickness from about 20 Å to about 80 Å, but in this embodiment about 40 Å. As a result of the conditions used to form the top oxide layer 46c, the thickness of the underlying nitride layer 46b does not substantially decrease during formation of the top oxide layer 46c. For example, if the nitride layer 46b is deposited at a thickness of 80 Å, after formation of the top oxide layer 46c, the nitride layer 46b has a thickness of at least about 76 Å. In this embodiment, the thickness of the nitride layer 46b is about 80 Å. Also as a result of the conditions used to form the top oxide layer 46c, it is possible to precisely control the thickness of the top oxide layer.

Referring to FIG. 2D, the second polysilicon layer is deposited. Specifically, a phosphorus doped amorphous polysilicon layer is deposited via CVD to form a doped polysilicon layer 48 at about 530° C., 400 mTorr, $SiH_4$ at 2,000 sccm, and a mixture of 1% by weight $PH_3$ in helium at about 75 sccm. Alternatively, the the second polysilicon layer can be deposited by LPCVD followed by ion implantation of a dopant such as phosphorus. Doping lowers the resistivity of the polysilicon rendering it conductive.

The remaining steps are generally well known in the art and may be varied. For instance, referring to FIG. 2E, in one embodiment a tungsten silicide layer 50 is deposited via, for example, LPCVD. The tungsten silicide layer 50 provides a lower resistance contact for improved flash memory cell performance. Poly-cap layer 52 is deposited over the tungsten silicide layer 50. The poly-cap layer 52 is about 500 Å thick, and is formed via, for example, LPCVD. The poly-cap layer 52 can be used to prevent any potential peeling or cracking of the underlying tungsten silicide 50. A capping layer 54, for example, of SiON is deposited over the poly-cap layer 52. The capping silicon oxynitride layer 54 provides an anti-reflective coating at masking and also acts as a masking layer for subsequent etching.

Referring to FIGS. 2F, suitable lithography and etching procedures are used to remove various portions of the device. After the second polysilicon layer 48, the tungsten silicide layer 50, the poly-cap layer 52 and the capping layer 54 have been formed (a plurality of word lines for the memory cells can be defined in this manner) etching is performed to define one or more pre-stack structures. The etching may be achieved by depositing and defining a photoresist masking layer over the entire surface of the substrate using standard lithography procedures. This is generally termed the gate mask and gate etch. Subsequently, a number of successive etching steps, such as the gate etch and the self aligned etch, are performed to define one or more stack structures 56. This is generally termed the self aligned mask and self aligned etch.

The gate mask and gate etch are performed as follows. First, a resist (not shown) is applied, selectively exposed to radiation and developed whereby various portions removed (either the exposed or unexposed portions). Next, in one embodiment, the etching steps take place in a multi-chamber etch tool wherein a silicon oxynitride capping layer is selectively etched with a fluorinated chemistry such as $CHF_3$—$O_2$ in an oxide chamber. The exposed poly-cap layer and the tungsten silicide layer are then etched with $SF_6$/HBr (or alternatively, $SF_6$/$Cl_2$ or $Cl_2$—$O_2$) and the exposed second polysilicon layer is etched with HBr—$O_2$ in a poly chamber. Etching steps are preferably formed in an integrated process in which the wafers are not exposed to atmosphere when transferring the wafers from one chamber to another.

Once the second polysilicon layer 48, the tungsten silicide layer 50, the poly-cap layer 52 and the capping layer 54 have been removed, a self aligned etch ("SAE") is performed to remove the ONO layer 46 and the phosphorus doped poly-silicon layer (first polysilicon layer) 44 in the regions that are not covered by the pre-stack structure (constituted by the unremoved second polysilicon layer, tungsten silicide layer, poly-cap layer and capping layer). The SAE etch is a two step etch process in which the ONO layer 46 is first removed using, for example, a $CF_4$—$O_2$ RIE etch, The second phase of the SAE etch is the removal of the exposed first polysilicon layer 44 to thereby further define the floating gate structures for each respective word line. The polysilicon etch includes, for example, an HBr—$O_2$ or a HBr—$Cl_2$—$O_2$ RIE etch chemistry. The gate etch and SAE serve to define the stack structure 56.

Figure 2H:
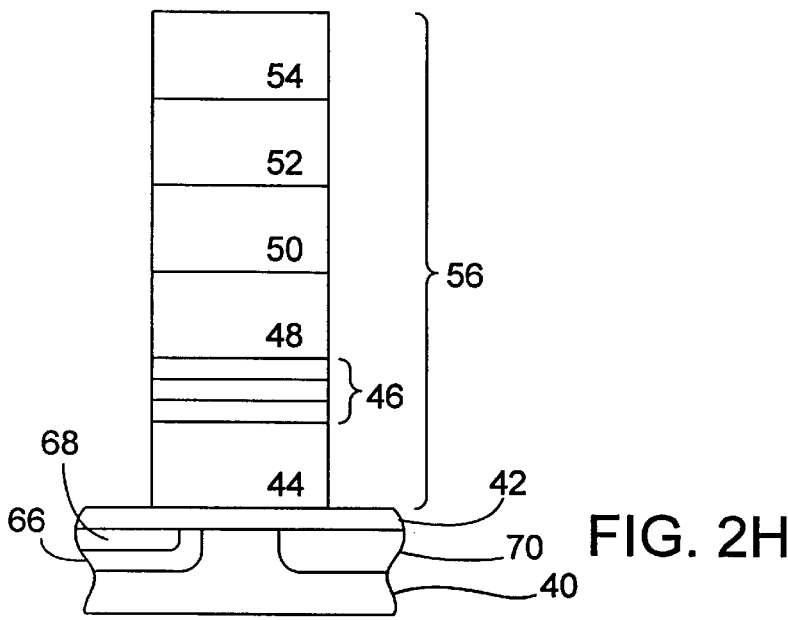

The fabrication of the flash memory cells is then completed by forming the source and drain regions by, for example, ion implantation. During the formation of the source and drain regions, the stacked gate structure 56 serves as a self-aligning mechanism. Specifically referring to FIG. 2G, resist 62 is applied and selectively stripped followed by performing a first ion implantation using phosphorus ($1\times10^{14}$ ions/cm$^2$ at 60 KeV) to form an N-type source region 64 (double diffused implant). Referring to FIG. 2H, resist 62 is removed followed by performing a second ion implantation using arsenic ($5\times10^{14}$ ions/cm$^2$ at 40 KeV) to form deep N-type source region 66, shallow N-type source region 68 and N-type drain region 70 (modified drain diffusion). Annealing completes the formation of the source and drain regions. In the above manner, an easy method for forming flash memory cells is provided. Although a flash memory cell with a double-diffused source region is described, the present invention is also applicable to flash memory cells with a single-diffused source region.

During programming, the source regions 66 and 68 and the substrate 40 of the memory cell may be tied to a ground via a terminal (not shown), respectively, the drain region 70 is. coupled to a relatively high voltage (for example, between about +5 V to about +9 V) via a terminal (not shown) and the control gate 48 is connected to a relatively high voltage level (for example, above about +10 V) via a terminal (not shown). Electrons are accelerated from the source regions 66 and 68 to the drain region 70 and so-called "hot-electrons" are generated near the drain region 70. Some of the hot electrons are injected through the relatively thin tunnel oxide layer 42 and become trapped in the floating gate 44 thereby providing the floating gate 44 with a negative potential.

During erasure, a high positive voltage (such as above about +12 V) is applied to the source regions 66 and 68 via a source terminal (not shown). A ground potential ($V_g$ equals 0 V) is applied to the control gate 48 via the control terminal (not shown). A similar ground potential ($V_{sub}$ equals 0 V) is applied to the substrate 40 via a substrate terminal (not shown).

The voltage $V_D$ of the drain region 70 is permitted to float. In this mode, electrons previously stored during programming in the floating gate 44 pass through tunnel oxide layer 42 by way of Fowler-Nordheim tunneling and travel into the source regions 66 and 68 as a result of the electric field established between the control gate 48 and the source regions 66 and 68 ($V_{GS}$ equals about 12 V). Since the top oxide layer is characterized by reduced charge trapping, Fowler-Nordheim tunneling and travel of electrons from the floating gate 44 to the source regions 66 and 68 are facilitated.

Although the invention has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more other features of the other embodiments as may be desired and advantageous for any given or particular application.

What is claimed is:

1. A method of forming a flash memory cell, comprising:

forming a tunnel oxide on a substrate;

forming a first polysilicon layer over the tunnel oxide;

forming an insulating layer over the first polysilicon layer, the insulating layer comprising a first oxide layer over the first polysilicon layer, a nitride layer over the first oxide layer, and a second oxide layer over the nitride layer, wherein the second oxide layer is made by forming the second oxide layer by low pressure chemical vapor deposition at a temperature from about 600° C. to about 850° C. using $SiH_4$ and $N_2O$, and annealing in an $N_2O$ atmosphere at a temperature from about 700° C. to about 950° C.;

forming a second polysilicon layer over the insulating layer;

etching at least the first polysilicon layer, the second polysilicon layer and the insulating layer, thereby defining at least one stacked gate structure; and forming a source region and a drain region in the substrate, thereby forming at least one memory cell.

2. The method of claim 1, wherein the low pressure chemical vapor deposition deposits oxide at a rate from about 3.5 Å/min to about 5.5 Å/min.

3. The method of claim 1, wherein the low pressure chemical vapor deposition is conducted under a pressure from about 400 mTorr to about 750 mTorr.

4. The method of claim 1, wherein the low pressure chemical vapor deposition is conducted at a temperature from about 700° C. to about 800° C.

5. The method of claim 1, wherein the annealing in the $N_2O$ atmosphere is conducted at a temperature from about 700° C. to about 950° C.

6. The method of claim 1, wherein the low pressure chemical vapor deposition is conducted using a gas flow comprising from about 1 l to about 4 l of $N_2O$ and from about 10 sccm to about 30 sccm $SiH_4$.

7. The method of claim 1, wherein the annealing in the $N_2O$ atmosphere is performed for a time from about 40 seconds to about 80 seconds.

8. A method of forming an ONO insulating layer for a flash memory cell without substantially decreasing nitride layer thickness, comprising:

depositing a first oxide layer;

depositing a nitride layer to a first thickness; and depositing a second oxide layer by low pressure chemical vapor deposition at a temperature from about 600° C. to about 850° C. using $SiH_4$ and $N_2O$, and annealing the second oxide layer in an $N_2O$ atmosphere at a temperature from about 700° C. to about 950° C., wherein the nitride layer has a second thickness after deposition of the second oxide layer, and the second thickness is at least 95% of the first thickness.

9. The method of claim 8, wherein the second oxide layer has a thickness from about 30 Å to about 60 Å.

10. The method of claim 8, wherein the nitride layer has a thickness from about 70 Å to about 90 Å.

11. The method of claim 8, wherein the $N_2O$ atmosphere comprises at least about 95% $N_2O$.

12. The method of claim 8, wherein the low pressure chemical vapor deposition is conducted at a temperature from about 700° C. to about 800° C. and a pressure from about 500 mTorr to about 700 mTorr.

13. The method of claim 8, wherein the low pressure chemical vapor deposition is conducted using a gas flow comprising from about 1.1 l to about 2 l of $N_2O$ and from about 15 sccm to about 25 sccm of $SiH_4$.

14. A method of decreasing charge leakage from a floating gate to a control gate in a flash memory cell comprising a substrate, a tunnel oxide over the substrate, the floating gate over the tunnel oxide, an ONO insulating layer over the floating gate, and the control gate over the ONO insulating layer, wherein the ONO insulating layer comprises a first oxide layer over the floating gate, a nitride layer over the first oxide layer and a second oxide layer over the nitride layer, comprising:

forming the second oxide layer by low pressure chemical vapor deposition at a temperature from about 700° C. to about 800° C. using $SiH_4$ and $N_2O$; and annealing in an $N_2O$ atmosphere at a temperature from about 750° C. to about 900° C.

15. The method of claim 14, wherein the second oxide layer has a thickness from about 30 Å to about 60 Å.

16. The method of claim 14, wherein the low pressure chemical vapor deposition deposits oxide at a rate from about 3 Å/min to about 6 Å/min.

17. The method of claim 14, wherein the low pressure chemical vapor deposition is conducted under a pressure from about 500 mTorr to about 700 mTorr.

18. The method of claim 14, wherein the low pressure chemical vapor deposition is conducted using a gas flow comprising from about 1 l to about 4 l of $N_2O$ and from about 10 sccm to about 30 sccm of $SiH_4$.

19. The method of claim 14, wherein the low pressure chemical vapor deposition is conducted using a gas flow comprising from about 1.1 l to about 2 l of $N_2O$ and from about 15 sccm to about 25 sccm of $SiH_4$.

20. The method of claim 14, wherein the the $N_2O$ atmosphere comprises at least about 99% $N_2O$.

* * * * *